(12) United States Patent
Fu

(10) Patent No.: US 10,181,844 B1
(45) Date of Patent: Jan. 15, 2019

(54) CLOCK DUTY CYCLE CALIBRATION AND FREQUENCY MULTIPLIER CIRCUIT

(71) Applicant: ALL WINNER TECHNOLOGY CO. LTD, Zhuhai, Guangdong (CN)

(72) Inventor: Zhuojian Fu, Zhuhai (CN)

(73) Assignee: ALL WINNER TECHNOLOGY COMPANY, LIMITED, Tangjiawan Town (CN)

( * ) Notice: Subject to any disclaimer, the term of this patent is extended or adjusted under 35 U.S.C. 154(b) by 0 days.

(21) Appl. No.: 16/066,350

(22) PCT Filed: Nov. 4, 2016

(86) PCT No.: PCT/CN2016/104539
§ 371 (c)(1),
(2) Date: Jun. 27, 2018

(87) PCT Pub. No.: WO2017/157026
PCT Pub. Date: Sep. 21, 2017

(30) Foreign Application Priority Data

Mar. 16, 2016  (CN) .......................... 2016 1 0151078

(51) Int. Cl.
*H03K 5/00* (2006.01)
*H03K 19/20* (2006.01)
(Continued)

(52) U.S. Cl.
CPC ....... *H03K 5/1565* (2013.01); *H03K 5/00006* (2013.01); *H03L 7/085* (2013.01); *H03K 19/20* (2013.01)

(58) Field of Classification Search
CPC .. H03K 3/1565; H03K 5/00006; H03K 19/20; H03L 7/085
(Continued)

(56) References Cited

U.S. PATENT DOCUMENTS 5,646,564 A  7/1997 Erickson et al.
5,963,071 A  10/1999 Dowlatabadi
(Continued)

FOREIGN PATENT DOCUMENTS

CN  1487669 A  4/2004
CN  101227184 A  7/2008
(Continued)

OTHER PUBLICATIONS

ISR and Written Opinion, PCT/CN2016/104539, dated Feb. 8, 2017.

*Primary Examiner* — Dinh T Le
(74) *Attorney, Agent, or Firm* — Stuart T. Auvinen; gPatent LLC

(57) ABSTRACT

A clock duty cycle calibration and frequency multiplier circuit used in a square wave frequency multiplier has a multiplexing module, which performs a phase-inversion operation on a clock signal according to a control signal; a calibration module which adjusts the duty cycle according to a control signal, and outputs a clock signal with a 50% duty cycle; a delay module, which performs a delay operation on the clock signal according to a control signal; a detection module, which compares the clock signal and outputs a feedback signal; a control module, which outputs a control signal according to the feedback signal; a frequency multiplication module, which performs a frequency multiplication operation on the clock signal. Therefore, high-precision clock signal frequency multiplication is implemented with relatively low circuit complexity and low cost.

10 Claims, 4 Drawing Sheets

(51) Int. Cl.
*H03K 5/156* (2006.01)
*H03L 7/085* (2006.01)

(58) Field of Classification Search
USPC .......................................................... 327/175
See application file for complete search history.

(56) References Cited

U.S. PATENT DOCUMENTS 7,592,878 B2 *  9/2009  Fagg ........................ H03B 5/06
                                                      331/186
9,413,360 B2 *  8/2016  Chen ................... G06F 13/4295

FOREIGN PATENT DOCUMENTS

| CN | 103051337 A | 4/2013 |
|----|-------------|--------|
| CN | 104124964 A | 10/2014 |
| CN | 104753499 A | 7/2015 |
| CN | 105743463 A | 7/2016 |
| WO | WO9837656 A | 8/1998 |

* cited by examiner

CLOCK DUTY CYCLE CALIBRATION AND FREQUENCY MULTIPLIER CIRCUIT

TECHNICAL FIELD

The present invention relates to the field of integrated circuit technologies, and more particularly to a clock duty cycle calibration and frequency multiplier circuit used in a square wave frequency multiplier.

BACKGROUND OF THE INVENTION

In the field of radio communications and the field of clock signal generation, in order to achieve lower low in-band phase noise and high-frequency quantization noise, a clock signal frequency multiplication technology is required for reducing multiples of frequency multiplication of a phase-locked loop. The clock signal frequency multiplication technology may be implemented in a manner of an analog circuit and a digital circuit.

FIG. 1 shows a method of implementing clock signal frequency multiplication through a digital circuit. An exclusive-OR operation is performed on an input clock signal Vin and a clock signal obtained after the Vin being delayed by ΔT, to obtain a frequency multiplication output clock signal Vout. Generally, a duty cycle of an input clock signal is in a range of 40% to 60%. Implementing clock signal frequency multiplication through a digital circuit requires that the duty cycle of the input clock signal is close to 50% as much as possible, otherwise the output clock signal will include an additional spurious component. As shown in FIG. 2, the duty cycle of the input clock signal deviates from 50%. In this case, the output clock signal not only includes double frequency component of the input clock signal, but also includes single and triple frequency component. This deteriorates purity of the output clock signal of a phase-lock loop.

It can be learned from above that a difficulty of implementing clock signal frequency multiplication lies in calibration of a clock signal duty cycle. Using an analog circuit to implement calibration of a clock signal duty cycle is of relatively high power consumption and using a digital circuit to implement calibration of a clock signal duty cycle faces compromised restriction of a plurality of aspects such as phase noise, area, and dynamic range.

BRIEF SUMMARY OF THE INVENTION

An objective of the present invention is to provide a clock duty cycle calibration and frequency multiplier circuit, so as to implement high-precision clock signal frequency multiplication with relatively low circuit complexity and low cost.

The present invention provides a clock duty cycle calibration and frequency multiplier circuit, including:

a multiplexing module, configured to output a second clock signal CK2 after inverting an input first clock signal CKin based on a first control signal V1;

a calibration module, configured to adjust a duty cycle of the second clock signal CK2 based on a second control signal V2, and finally output a third clock signal CK3 with a 50% duty cycle of;

a delay module, configured to output a fourth clock signal CK4 after performing a delay operation on the third clock signal CK3 based on a third control signal V3;

a detection module, configured to compare the third clock signal CK3 and the fourth clock signal CK4 that are input thereto, and output a feedback signal Va based on a comparison result;

a control module, configured to output the first control signal V1, the second control signal V2, and the third control signal V3 based on the input feedback signal Va; and a frequency multiplication module, configured to perform a frequency multiplication operation on the third clock signal CK3, and output a fifth clock signal CKout.

Preferably, the calibration module includes a first delay unit, a second delay unit, and a gate circuit, the first delay unit and the second delay unit are connected in parallel, then connected to the gate circuit, and the first delay unit and the second delay unit are identical adjustable delay units.

Preferably, the gate circuit is an AND gate circuit or an OR gate circuit.

Preferably, the delay module includes:

a third delay unit, configured to perform delay processing on the third clock signal CK3; and a fourth delay unit, configured to further perform delay processing on a clock signal obtained after the third clock signal CK3 being delayed by the third delay unit, and output the fourth clock signal CK4, where the third delay unit and the fourth delay unit are connected in series and are identical adjustable delay units.

Preferably, the detection module includes:

a first edge-triggered flip-flop, configured to compare whether a phase difference between the third clock signal CK3 and the fourth clock signal CK4 is 360°, and output a comparison result as a feedback signal.

Preferably, when the phase difference between the third clock signal CK3 and the fourth clock signal CK4 is not 360°, a third delay unit and a fourth delay unit are adjusted of a same delay value.

Preferably, the detection module further includes:

a second edge-triggered flip-flop, configured to compare whether rising edges of square waves of the third clock signal CK3 and a clock signal obtained after the third clock signal CK3 being delayed by a third delay unit are aligned with falling edges, and output a comparison result as a feedback signal.

Preferably, when a phase difference between the third clock signal CK3 and the fourth clock signal CK4 is 360°, if the feedback signal of the second edge-triggered flip-flop is different from a preset value, the multiplexing module enables the first clock signal CKin to reversely pass; and the preset value is a feedback signal value of the second edge-triggered flip-flop when a duty cycle of the first clock signal CKin conforms to an operational rule of a gate circuit of the calibration module.

Preferably, when the rising edges of the square waves of the third clock signal CK3 and a clock signal obtained after the third clock signal CK3 being delayed by the third delay unit are not aligned with the falling edges, a delay value of the first delay unit or the second delay unit is adjusted.

Preferably, the frequency multiplication module includes:

a fixed delay unit, configured to perform delay processing on the third clock signal CK3; and an exclusive-OR gate circuit, configured to perform an exclusive-OR operation on the third clock signal CK3 and a clock signal obtained after the third clock signal CK3 being delayed by the fixed delay unit, to obtain a frequency-multiplied fifth clock signal CKout.

Compared with the prior art, a clock duty cycle calibration and frequency multiplier circuit of the present invention implements separation of a frequency multiplication delay unit and a calibration delay unit and simplifies circuit design. The calibration delay unit demands a large dynamic range and a small adjustment of step precision and have no requirement for phase noise performance; and the frequency multiplication delay unit may be fixed delay, and requires only low phase noise design. In this way, optimal design of different circuit modules can be implemented, and power consumption and area consumption are reduced.

DETAILED DESCRIPTION OF THE INVENTION

A clock duty cycle calibration and frequency multiplier circuit according to the present invention is used to perform delay, comparison, and a logic operation on a clock signal, so as to implement high-precision clock signal frequency multiplication with relatively low circuit complexity and low cost.

The present invention can be readily understood by the following detailed description of the preferred embodiment, with reference made to the accompanying drawings.

Figure 1:
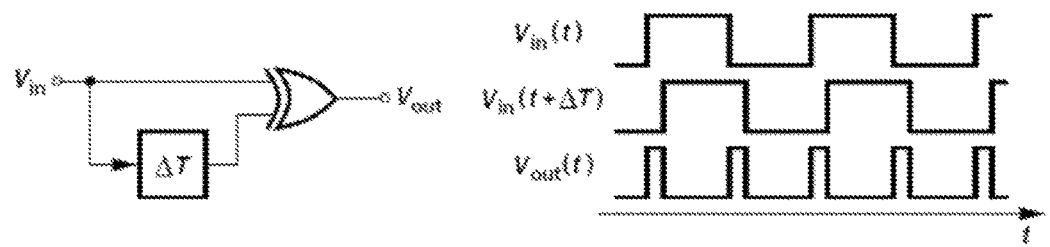
FIG. 1 is a schematic diagram of a clock signal frequency multiplication implemented through a digital circuit.
Figure 2:
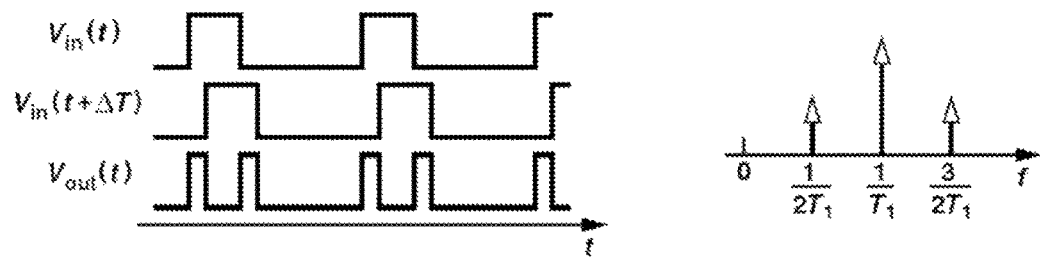
FIG. 2 is a schematic diagram of an output clock signal when a duty cycle of an input clock signal in a clock signal frequency multiplier circuit deviates from 50%.
Figure 3:
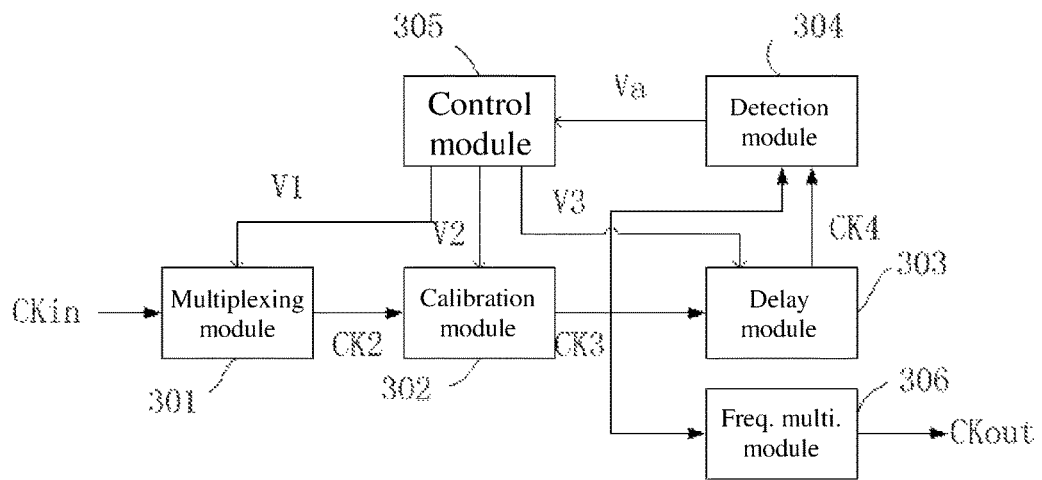
FIG. 3 is a diagram of functional modules of a clock duty cycle calibration and frequency multiplier circuit according to the present invention.

Referring to FIG. 3, the clock duty cycle calibration and frequency multiplier circuit according to the present invention includes a multiplexing module 301, a calibration module 302, a delay module 303, a detection module 304, a control module 305, and a frequency multiplication module 306.

The multiplexing module 301 inverts an input first clock signal CKin based on a first control signal V1, then outputs a second clock signal CK2 to the calibration module 302. In an implementation, the multiplexing module 301 may use a multiplexer.

The calibration module calibration module 302 adjusts a duty cycle of the second clock signal CK2 based on a second control signal V2, and finally outputs a third clock signal CK3 with a 50% duty cycle to the delay module 303, the detection module 304, and the frequency multiplication module 306. In an implementation, the calibration module 302 includes a differential phase adjustment circuit and a gate circuit. The differential phase adjustment circuit includes two identical adjustable delay units.

The delay module 303 performs a delay operation on the third clock signal CK3 based on a third control signal V3, then outputs a fourth clock signal CK4 to the detection module 304. In an implementation, the delay module 303 includes two identical adjustable delay units.

The detection module 304 compares the third clock signal CK3 and the fourth clock signal CK4 that are input thereto, and outputs a feedback signal Va, based on a comparison result, to the control module 305. In an implementation, the detection module 304 includes two edge-triggered flip-flops.

The control module 305 outputs the first control signal V1, the second control signal V2, and the third control signal V3 based on the input feedback signal Va. In an implementation, the control module 305 may control the delay unit and the multiplexer by using the feedback signal of the edge-triggered flip-flop. Specifically, how to control the delay unit and the multiplexer is a prior art, and therefore details are not described herein.

In a specific implementation, the detection module 304 includes two edge-triggered flip-flops. One edge-triggered flip-flop is configured to detect whether rising edges of square waves of the input third clock signal CK3 and the output fourth clock signal CK4 of the delay module 304 are aligned, that is, whether a phase difference between input and output clock signals is 360°. The control module 305 performs adjustment operations of same delay values on these two delay units of the delay module 303 based on a detection result, to enable the phase difference between the input and the output clock signals to be 360°. Then the other edge-triggered flip-flop is configured to detect whether rising edges of square waves of the input third clock signal CK3 of the delay module 304 and an output clock signal of a delay unit at an input end of the delay module 304 are aligned with falling edges. The control module 305 firstly determines, based on a feedback signal of the edge-triggered flip-flop and a gate circuit used by the calibration module 302 in this case, whether to control the multiplexing module 301 to invert the first clock signal CKin, and then adjusts a delay value to a delay unit of the calibration module 302. When rising edges of square waves of the third clock signal CK3 and an output clock signal of the delay unit are aligned with falling edges, a duty cycle of the third clock signal CK3 is 50%.

The frequency multiplication module 306 performs a frequency multiplication operation on the third clock signal CK3, and outputs a fifth clock signal CKout. In an implementation, the frequency multiplication module 306 includes a fixed delay unit and an exclusive-OR gate circuit.

The present invention will be described in detail through two embodiments below.

Figure 4:
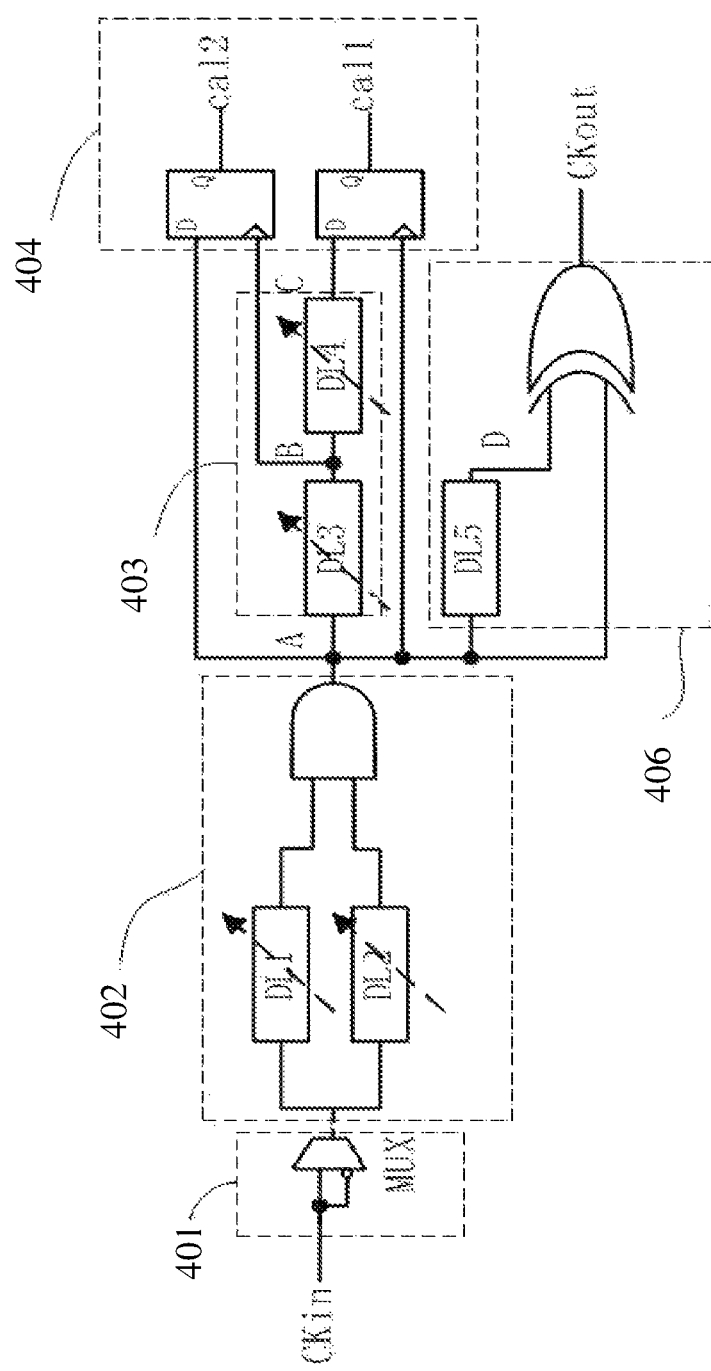
FIG. 4 is a schematic diagram of a circuit structure of an embodiment of a clock duty cycle calibration and frequency multiplier circuit according to the present invention.
Figure 5:
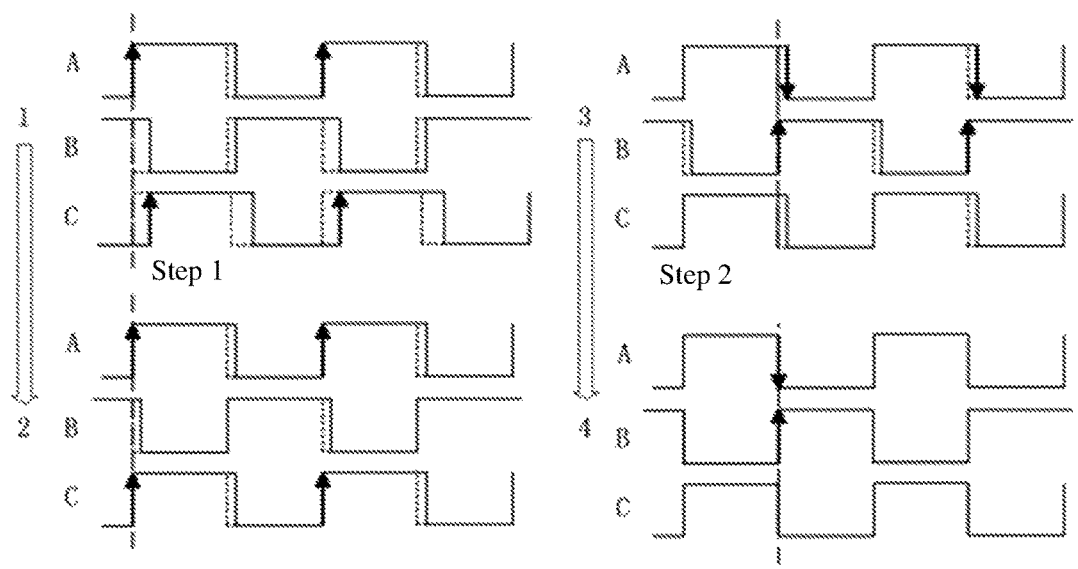
FIG. 5 is a timing diagram of a clock signal status in a calibration process of the circuit structure in FIG. 4.

FIG. 4 and FIG. 5 are a schematic diagram of a circuit structure of an embodiment of a clock duty cycle calibration and frequency multiplier circuit according to the present invention, and a timing diagram of a clock signal status in a calibration process, respectively.

Referring to FIG. 4, multiplexing module 401 in this embodiment includes a multiplexer MUX; calibration module 402 includes a differential phase adjustment circuit that includes two identical adjustable delay units DL1 and DL2, and an AND gate circuit; delay module 403 includes two identical adjustable delay units DL3 and DL4 connected in series; detection module 404 includes two rising edge D flip-flops generating outputs cal1 and cal2, wherein a first flip-flop outputting cal1 is configured to detect whether rising edges of square waves of clock signals at node A and node C at a same timing are aligned, a second flip-flop generating cal2 is configured to detect whether a rising edge of a square wave of a clock signal at node B is aligned with a falling edge of a square wave of a clock signal at node A at a same timing, and these two flip-flops feed back detection results to the control module; frequency multiplication module 406 includes a fixed delay unit DL5 and an exclusive-OR gate circuit.

A calibration and frequency multiplication process in this embodiment will be described in detail with reference to FIG. 5. Before duty cycle calibration and frequency multiplication are performed on a clock signal, the delay units DL1 and DL2 are firstly adjusted to a same delay value. In this way, after a clock signal is input, a duty cycle of a clock signal at node A is consistent with that of the input clock signal, thereby avoiding a technical requirement of approximately zero delay when only a single delay unit is used and avoiding a technical requirement on dynamic ranges of the two delay units DL1 and DL2 if used. And the fixed delay unit DL5 is set to be a delay value based on a multiplication value needed.

Firstly, a clock signal is input. In this step, the duty cycle value of the input clock signal does not affect implementation of the present invention. Here, a square wave of a clock signal with a duty cycle greater than 50% is used for description. In this case, a waveform diagram of clock signals at three nodes A, B and C in the circuit is shown in 1 in step 1. A rising edge of a square wave of a clock signal at node C is needed to be aligned with a rising edge of a square wave of a clock signal at node A. That is, a phase difference between clock signals at nodes A and C is adjusted to 360°. Now, the clock signals at two nodes A and C are input to the rising edge D flip-flop cal1 simultaneously. And the rising edge D flip-flop cal1 outputs a feedback signal value Q=0 to the control module. The control module outputs a control signal to the delay units DL3 and DL4 based on the feedback signal value Q=0 input by the rising edge D flip-flop cal1. The delay units DL3 and DL4 perform delay operations on the clock signal based on the input control signal, to gradually increase delay values till that the rising edge of the square wave of the clock signal at node C is aligned with the rising edge of the square wave of the clock signal at node A, as shown in 2 in step 1. Then the feedback signal value output by the rising edge D flip-flop cal1 is changed to Q=1. And the control module controls the delay units DL3 and DL4 to keep the delay values at this time based on the change of the feedback signal output by the rising edge D flip-flop cal1. At this time, the phase difference between the clock signals at nodes A and C is 360°. In step 1, the control module does not respond to a feedback signal of the rising edge D flip-flop cal2.

Subsequently, after the phase difference between the clock signals at nodes A and C is 360°, because the delay units DL3 and DL4 are identical delay units, a phase difference between clock signals at two nodes A and B is 180°, then the control module starts to respond to the feedback signal of the rising edge D flip-flop cal2. In this embodiment, the calibration module uses an AND gate circuit to perform clock signal duty cycle calibration. Therefore, the duty cycle of the clock signal input into the calibration module is needed to be greater than 50% so that a clock signal with a 50% duty cycle can be obtained by using an operation of the AND gate. The delay units DL1 and DL2 are set to be same delay values. That is, the duty cycle of the clock signal input into the calibration module is consistent with that of the clock signal output at node A, and the control module firstly controls, based on the feedback signal input by the rising edge D flip-flop cal2, the multiplexer MUX to adjust the duty cycle of the clock signal at node A. If the duty cycle of the input clock signal is greater than 50%, the waveform diagram of the clock signals at three nodes A, B and C in the circuit is shown in 3 in step 2, and the rising edge D flip-flop cal2 outputs a feedback signal value Q=1. If the duty cycle of the input clock signal is less than 50%, because the phase difference between the clock signals at two nodes A and B is 180°, the rising edge D flip-flop cal2 outputs a feedback signal value Q=0. When the feedback signal value Q=1, the control module controls the multiplexer MUX to enable the input clock signal to pass directly. The operation can ensure the duty cycle of the clock signal at node A to be greater than 50%. That is, the clock signal duty cycle input into the calibration module is greater than 50%. When the control module determines that the rising edge D flip-flop cal2 outputs the feedback signal value Q=1, the control module controls the multiplexer MUX to keep its status. After the duty cycle of the clock signal at node A is adjusted, a rising edge of a square wave of a clock signal at node B starts to be aligned with a falling edge of a square wave of a clock signal at node A. The waveform diagram of the clock signals at three nodes A, B and C in the circuit is shown in 3 in step 2. The control module outputs a control signal to the delay units DL1 and DL2 based on the feedback signal value Q=0 input by the rising edge D flip-flop cal2. The delay units DL1 and DL2 perform delay operations on the clock signals based on the input control signal. An AND operation is performed on the clock signals that has been delayed by the delay units DL1 and DL2, to gradually decrease duty cycle. Because the phase difference between the clock signals at two nodes A and B is 180°, the rising edge of the square wave of the clock signal at node B is gradually aligned with the falling edge of the square wave of the clock signal at node A as the duty cycles decrease. When a falling edge of the square wave of the clock signal at node A is aligned with a rising edge of the square wave of the clock signal at node B, a square wave of a clock signal at each node is shown in 4 in step 2, and the feedback signal value output by the rising edge D flip-flop cal2 is changed to Q=0. The control module controls the delay units DL1 and DL2 to keep delay values at this time based on the change of the feedback signal output by the rising edge D flip-flop cal2. Because the phase difference between the clock signals at the nodes A and B is 180°, clock signals of a 50% duty cycles are obtained at three nodes A, B and C. In actual application, based on a technical feature of a square wave of a clock signal, the operating principle of a flip-flop is of a successive approximation type. That is, when the edges of two nodes are close to an extent, the flip-flop flips. Close/approximation precision is determined by the property of a used flip-flop and delay unit, and this also determines the precision of a clock signal duty cycle finally obtained. In another implementation, the clock signals input to the control ends of a rising edge flip-flop may be exchanged, and the edge-triggered flip-flop configured to detect aligning of edges of two nodes A and B may also use a falling edge flip-flop.

Finally, a square wave of a clock signal with a 50% duty cycles is output, at the node A, to the frequency multiplication module including a fixed delay unit DL5 and an exclusive-OR gate circuit. An exclusive-OR operation is performed on the clock signal and a clock signal obtained after the clock signal being delayed by a pre-adjusted fixed delay unit DL5, so that a pure frequency multiplication output of the input clock signal can be obtained.

Figure 6:
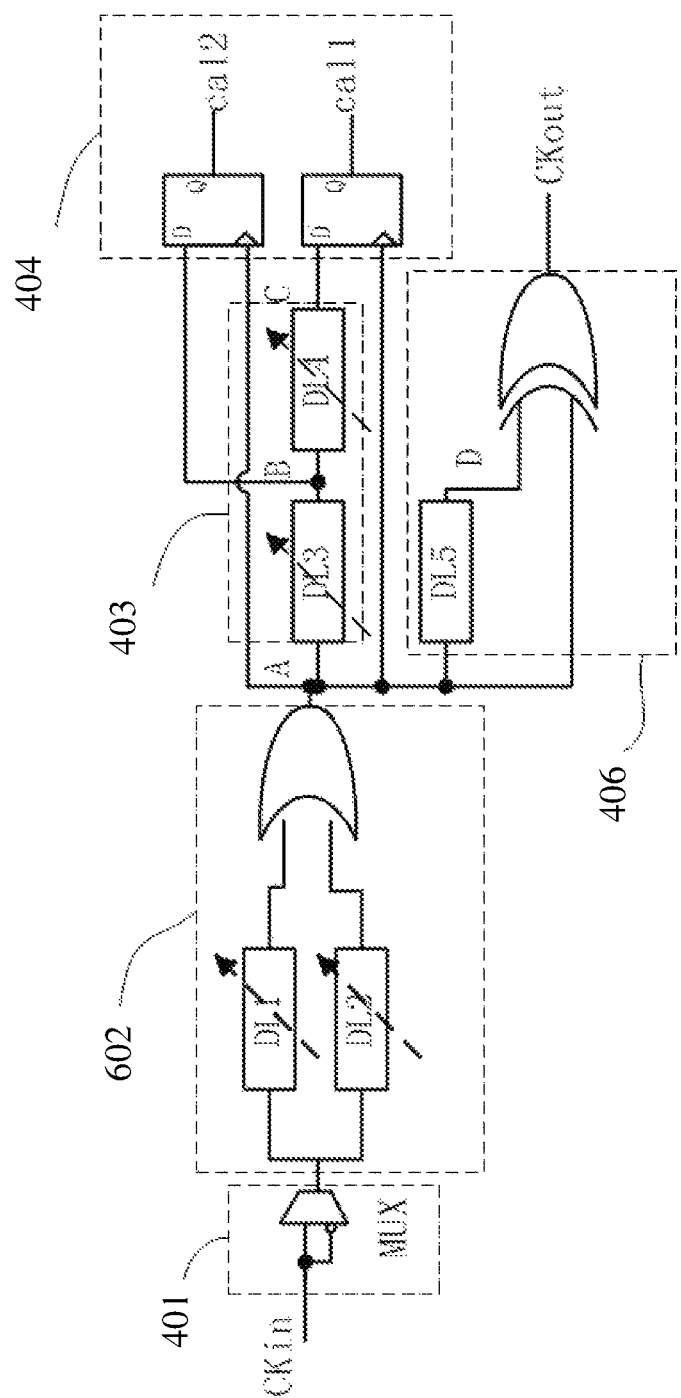
FIG. 6 is a schematic diagram of a circuit structure of another embodiment of a clock duty cycle calibration and frequency multiplier circuit according to the present invention.

FIG. 6 shows a circuit structure of another embodiment of a clock duty cycle calibration and frequency multiplier circuit according to the present invention. A difference of this embodiment from the embodiment shown in FIG. 4 is that calibration module 602 uses an OR gate circuit to adjust a clock signal duty cycle. This demands that the duty cycle of the clock signal input into the calibration module is less than 50%, and the input to a control end of an edge-triggered flip-flop for nodes A and B is the clock signal at node A. In this embodiment, only the control behavior of the control module based on different feedback signals from the edge-triggered flip-flop needs to be adjusted, to achieve the objective of the present invention.

The clock duty cycle calibration and frequency multiplier circuit of the present invention implements separation design of a dynamic range and an adjustment resolution of the delay unit of the frequency multiplier circuit, also implements separation design of phase noise performance and a power consumption area of the delay unit, and greatly reduces complexity of circuit design. Separation of frequency multiplication delay unit and calibration delay unit simplifies the circuit design. The calibration delay unit demands a large dynamic range and a small adjustment of step precision and have no requirement for the phase noise performance; and the frequency multiplication delay unit may be fixed delay and requires only low phase noise design. In this way, optimal design of different circuit modules can be implemented, and power consumption and area consumption are reduced.

It should be understood that the above preferred embodiments are merely used to describe the technical solutions of the present invention and are not intended to limit the present invention. For a person skilled in the art, modifications may be made to the technical solutions recorded in the foregoing preferred embodiments, or equivalent replacements may be made on some of the technical features therein. These modifications or replacements shall fall within the protection scope of the claims of the present invention.

What is claimed is:

1. A clock duty cycle calibration and frequency multiplier circuit, comprising:
   a multiplexing module, configured to output a second clock signal after inverting an input first clock signal based on a first control signal;
   a calibration module, configured to adjust a duty cycle of the second clock signal based on a second control signal, and finally output a third clock signal with a 50% duty cycle;
   a delay module, configured to output a fourth clock signal after performing a delay operation on the third clock signal based on a third control signal;
   a detection module, configured to compare the third clock signal and the fourth clock signal that are input thereto, and output a feedback signal based on a comparison result;
   a control module, configured to output the first control signal, the second control signal, and the third control signal based on the input feedback signal; and
   a frequency multiplication module, configured to perform a frequency multiplication operation on the third clock signal, and output a fifth clock signal.

2. The clock duty cycle calibration and frequency multiplier circuit according to claim 1, wherein the calibration module comprises a first delay unit, a second delay unit, and a gate circuit, the first delay unit and the second delay unit are connected in parallel and then being connected to the gate circuit, and the first delay unit and the second delay unit are identical adjustable delay units.

3. The clock duty cycle calibration and frequency multiplier circuit according to claim 2, wherein the gate circuit is an AND gate circuit or an OR gate circuit.

4. The clock duty cycle calibration and frequency multiplier circuit according to claim 1, wherein the delay module comprises:
   a third delay unit, configured to perform delay processing on the third clock signal; and
   a fourth delay unit, configured to further perform delay processing on the third clock signal that has been delayed by the third delay unit, and output the fourth clock signal, wherein
   the third delay unit and the fourth delay unit are connected in series, and are identical adjustable delay units.

5. The clock duty cycle calibration and frequency multiplier circuit according to claim 1, wherein the detection module comprises:
   a first edge-triggered flip-flop, configured to compare whether a phase difference between the third clock signal and the fourth clock signal is 360°, and output a comparison result as a feedback signal.

6. The clock duty cycle calibration and frequency multiplier circuit according to claim 5, wherein when the phase difference between the third clock signal and the fourth clock signal is not 360°, the third delay unit and the fourth delay unit are adjusted of a same delay value.

7. The clock duty cycle calibration and frequency multiplier circuit according to claim 1, wherein the detection module further comprises:
   a second edge-triggered flip-flop, configured to compare whether rising edges of square waves of the third clock signal and a clock signal obtained after the third clock signal being delayed by a third delay unit are aligned with falling edges, and output a comparison result as a feedback signal.

8. The clock duty cycle calibration and frequency multiplier circuit according to claim 7, wherein when a phase difference between the third clock signal and the fourth clock signal is 360°, if the feedback signal of the second edge-triggered flip-flop is different from a preset value, the multiplexing module enables the first clock signal to reversely pass; and
   the preset value is a feedback signal value of the second edge-triggered flip-flop when a duty cycle of the first clock signal conforms to an operational rule of a gate circuit of the calibration module.

9. The clock duty cycle calibration and frequency multiplier circuit according to claim 8, wherein when the rising edges of the square waves of the third clock signal and a clock signal obtained after the third clock signal being delayed by the third delay unit are not aligned with the falling edges, a delay value of the first delay unit or the second delay unit is adjusted.

10. The clock duty cycle calibration and frequency multiplier circuit according to claim 1, wherein the frequency multiplication module comprises:
   a fixed delay unit, configured to perform delay processing on the third clock signal; and
   an exclusive-OR gate circuit, configured to perform an exclusive-OR operation on the third clock signal and a clock signal obtained after the third clock signal is delayed by the fixed delay unit, to obtain a frequency-multiplied fifth clock signal.

* * * * *